(12) United States Patent
Chang

(10) Patent No.: US 8,009,494 B2
(45) Date of Patent: Aug. 30, 2011

(54) SEMICONDUCTOR MEMORY DEVICE IMPLEMENTING FULL-VDD BIT LINE PRECHARGE SCHEME USING BIT LINE SENSE AMPLIFIER

(75) Inventor: Soo-bong Chang, Incheon (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 12/460,128

(22) Filed: Jul. 14, 2009

(65) Prior Publication Data

US 2010/0182860 A1    Jul. 22, 2010

(30) Foreign Application Priority Data

Jan. 19, 2009  (KR) .................. 10-2009-0004192
Feb. 16, 2009  (KR) .................. 10-2009-0012600

(51) Int. Cl.
*G11C 7/00* (2006.01)

(52) U.S. Cl. ........................................ 365/203; 365/205
(58) Field of Classification Search .................. 365/203, 365/205
See application file for complete search history.

(56) References Cited

U.S. PATENT DOCUMENTS 6,097,649 A * 8/2000 Chiang et al. ................. 365/203

FOREIGN PATENT DOCUMENTS

| KR | 1999-0050491 | 7/1999 |
| KR | 2000-0021078 A | 4/2000 |
| KR | 10-2007-0018221 A | 2/2007 |

* cited by examiner

*Primary Examiner* — Michael T Tran
(74) *Attorney, Agent, or Firm* — Mills & Onello, LLP

(57) ABSTRACT

A semiconductor memory device using a full-VDD bit line precharge scheme by using a bit line sense amplifier includes a precharge unit precharging a bit line and a complementary bit line from a power voltage to a voltage that is less than the power voltage by a predetermined voltage, and the bit line sense amplifier including first and second transistors serially connected between the bit line and the complementary bit line to be cross-coupled to each other, wherein a gate of the first transistor is connected to the complementary bit line and a gate of the second transistor is connected to the bit line. The precharge unit precharges, in response to a first precharge signal, the bit line and the complementary bit line to a voltage that is less than the power voltage by a threshold voltage of the first or second transistor, and precharges, in response to a second precharge signal, the bit line and the complementary bit line from the power voltage to a voltage that is less than the power voltage by half of a threshold voltage of the first or second transistor.

24 Claims, 6 Drawing Sheets

SEMICONDUCTOR MEMORY DEVICE IMPLEMENTING FULL-VDD BIT LINE PRECHARGE SCHEME USING BIT LINE SENSE AMPLIFIER

CROSS-REFERENCE TO RELATED APPLICATIONS

This application claims the benefit of Korean Patent Application Nos. 10-2009-0004192 and 10-2009-0012600, respectively filed on Jan. 19, 2009 and Feb. 16, 2009, in the Korean Intellectual Property Office, the contents of which are incorporated herein in their entirety by reference.

BACKGROUND

The inventive concept relates to a semiconductor memory device, and more particularly, to a semiconductor memory device using a full-power voltage (VDD) bit line precharge scheme using a bit line sense amplifier and a method of configuring the semiconductor memory device.

Dynamic random access memories (DRAMs), which are semiconductor memory devices, sense and amplify data stored in a memory cell by using a sense amplifier. The sense amplifier is connected to a bit line in the memory cell, and senses the data stored in the memory cell by comparing a charge sharing voltage obtained using charge sharing with the bit line with a bit line precharge voltage. The degree of accuracy of the sensed data depends on the amount of charge stored in the memory cell and the charge sharing that is affected by the capacitance of the bit line. Accordingly, a proper bit line precharge scheme is important for enhancing a data access speed of the DRAMs, and thus increase a sensing speed.

As a power voltage decreases and a voltage difference between a logic level "1" and a logic level "0" decreases, attempts have been made to develop a substitute for a conventional half VDD bit line precharge scheme. Thus, a full-VDD bit line precharge (FVBP) scheme by which a bit line is precharged to a VDD and a VSS bit line precharge scheme by which a bit line is precharged to a ground voltage (VSS) have been proposed.

However, the FVBP scheme is difficult to acceptably and stably sense data having a logic level "1" because if the data stored in the memory cell is "1", there is no charge sharing voltage for the bit line. Also, the VSS bit line precharge scheme is difficult to acceptably and stably sense data having a logic level "0" because if the data stored in the memory cell is "0", there is no charge sharing voltage for the bit line.

Accordingly, if a charge sharing voltage can be generated even though the data stored in the memory cell is "1", the FVBP scheme is required to acceptably and stably sense the data at an optimal speed.

SUMMARY

The inventive concept provides a semiconductor memory device that can precharge a bit line by using a bit line sense amplifier in a full-power voltage (VDD) bit line precharge (FVBP) scheme.

The inventive concept also provides a method of configuring the semiconductor memory device.

According to an aspect of the inventive concept, there is provided a semiconductor memory device comprising: a bit line pair comprising a bit line and a complementary bit line; a precharge unit precharging the bit line and the complementary bit line to a voltage that is a first voltage less than the power voltage; and a sense amplifying unit comprising first and second transistors driven by a first current source and serially connected between the bit line and the complementary bit line to be cross-coupled to each other, wherein a gate of the first transistor is connected to the complementary bit line and a gate of the second transistor is connected to the bit line, wherein the first voltage is determined by the first or the second transistor.

The precharge unit may comprise: a third transistor connected between a node to which the first and second transistors and the first current source are connected, and a power voltage terminal, the third transistor being controlled by a first precharge signal; and a fourth transistor connected between the bit line and the complementary bit line and controlled by a second precharge signal. The second precharge signal may be activated a predetermined period of time after the first precharge signal is activated.

The sense amplifying unit may further comprise third and fourth transistors driven by a second current source and serially connected between the bit line and the complementary bit line to be cross-coupled to each other, wherein a gate of the third transistor is connected to the complementary bit line and a gate of the fourth transistor is connected to the bit line, wherein the first voltage is determined by the third or fourth transistor. Each of the first and fourth transistors of the sense amplifying unit may have a driving capability that is greater than that of each of the second and third transistors of the sense amplifying unit.

The precharge unit may comprise: a fifth transistor connected between a node to which the first and second transistors and the first current source are connected and a first voltage terminal, the fifth transistor being controlled by a first precharge signal; a sixth transistor connected between a node to which the third and fourth transistors and the second current source are connected and the first voltage terminal, the sixth transistor being controlled by the first precharge signal; and a seventh transistor connected between the bit line and the complementary bit line and controlled by a second precharge signal. The second precharge signal may be activated a predetermined period of time after the first prescharge signal is activated.

According to another aspect of the inventive concept, there is provided a semiconductor memory device comprising: a bit line pair comprising a bit line and a complementary bit line; a sense amplifying unit comprising a first sense amplifier driven by a first current source and connected between the bit line and the complementary bit line, and a second sense amplifier driven by a second current source and connected between the bit line and the complementary bit line; a first precharge unit precharging, in response to a first precharge signal, a first node to which the first current source in the first sense amplifier is connected and a second node to which the second current source in the second sense amplifier is connected; and a second precharge unit equalizing, in response to a second precharge signal, the first node and the second node.

The first precharge unit may comprise: a first transistor connected between the first node and a power voltage terminal and controlled by the first precharge signal; and a second transistor connected between the second node and the power voltage terminal and controlled by the first precharge signal. The second precharge unit may comprise a third transistor connected between the bit line and the complementary bit line and controlled by the second precharge signal. The second precharge signal may be activated a predetermined period of time after the first precharge signal is activated.

The sense amplifying unit may further comprise first and second p-channel metal oxide semiconductor (PMOS) transistors serially connected between the bit line and the complementary bit line to be cross-coupled to each other, wherein a gate of the first PMOS transistor is connected to the complementary bit line and a gate of the second PMOS transistor is connected to the bit line. A connection node between the first and second PMOS transistors may be connected to a power voltage terminal.

The sense amplifying unit may further comprise first and second PMOS transistors serially connected between the bit line and the complementary bit line to be cross-coupled to each other, wherein a gate of the first PMOS transistor is connected to the complementary bit line and a gate of the second PMOS transistor is connected to the bit line. A connection node between the first and second PMOS transistors may be connected to a power voltage terminal through a third PMOS transistor that responds to a sensing enable signal.

According to another aspect of the inventive concept, there is provided a semiconductor memory device comprising: a bit line pair comprising a bit line and a complementary bit line; a precharge unit precharging the bit line and the complementary bit line to a voltage that is a first voltage less than the precharge voltage; and a sense amplifying unit comprising first and second transistors serially connected between the bit line and the complementary bit line to be cross-coupled to each other, wherein a gate of the first transistor is connected to the complementary bit line and a gate of the second transistor is connected to the bit line. The first voltage may be determined by the first or second transistor.

The precharge unit may comprise: a third transistor connected between a precharge voltage terminal and a connection node between the first transistor and the second transistor, and controlled by the precharge signal; a fourth transistor connected between the precharge voltage terminal and the bit line and controlled by the precharge signal; a fifth transistor connected between the precharge voltage terminal and the complementary bit line and controlled by the precharge signal; and a sixth transistor connected between the bit line and the complementary bit line and controlled by the precharge signal.

The sense amplifying unit may further comprise first and second PMOS transistors serially connected between the bit line and the complementary bit line to be coupled to each other, wherein a gate of the first PMOS transistor is connected to the complementary bit line and a gate of the second PMOS transistor is connected to the bit line, wherein a connection node between the first and second PMOS transistors is connected to a power voltage terminal.

The sense amplifying unit may further comprise first and second PMOS transistors serially connected between the bit line and the complementary bit line to be cross-coupled to each other, wherein a gate of the first PMOS transistor is connected to the complementary bit line and a gate of the second PMOS transistor is connected to the bit line, wherein a connection node between the first and second PMOS transistors is connected to a power voltage terminal through a third PMOS transistor that responds to a sensing enable signal.

According to another aspect of the inventive concept, there is provided a method of configuring a semiconductor memory device comprising: providing a bit line to which a first memory cell is connected; providing a complementary bit line to which a second memory cell is connected; providing an asymmetric sense amplifier comprising first and second transistors connected to a first current source and connected between the bit line and the complementary bit line to be cross-coupled to each other and third and fourth transistors connected to a second current source and connected between the bit line and the complementary bit line to be cross-coupled to each other, wherein each of the first and fourth transistors has a current driving capability that is greater than that of each of the second and third transistors; and disposing the third transistor having the low current driving capability adjacent to the first memory cell and the second transistor having the low current driving capability adjacent to the second memory cell.

The first transistor may be disposed adjacent to the second transistor. The first transistor may comprise active areas the number of which is equal to a number obtained by dividing the width of the first transistor by the width of the second transistor.

The fourth transistor may be disposed adjacent to the third transistor. The fourth transistor may comprise active areas the number of which is equal to a number obtained by dividing the width of the fourth transistor by the width of the third transistor.

The first transistor and the fourth transistor may have the same size. The second transistor and the third transistor may have the same size.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
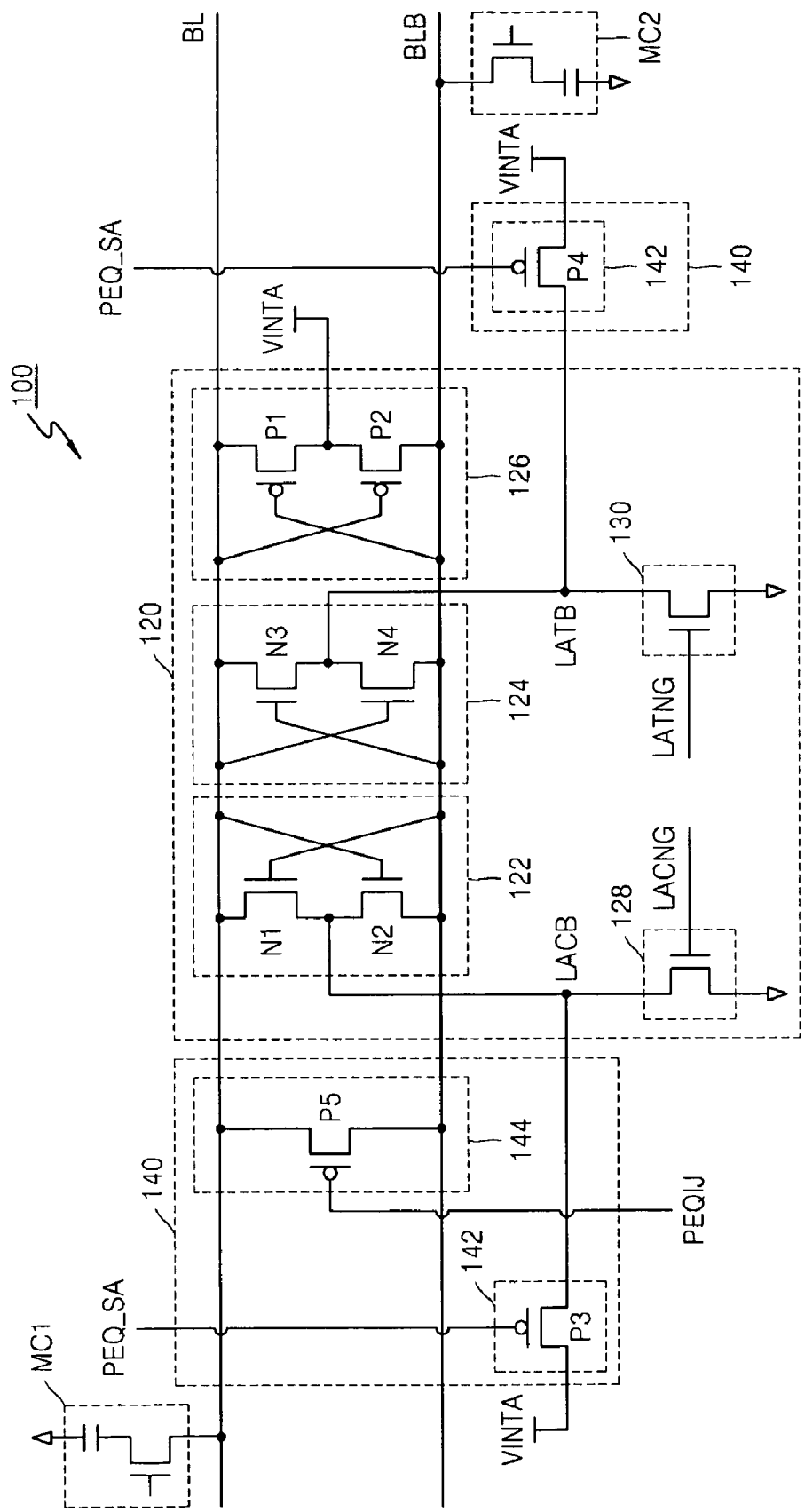
FIG. 1 is a circuit diagram of a semiconductor memory device according to an embodiment of the inventive concept.

The attached drawings for illustrating embodiments of the inventive concept are referred to in order to gain a sufficient understanding of the inventive concept, the merits thereof, and the objectives accomplished by the implementation of the inventive concept.

Hereinafter, the inventive concept will be described in detail by describing embodiments of the inventive concept with reference to the attached drawings. Like reference numerals in the drawings denote like elements.

FIG. 1 is a circuit diagram of a semiconductor memory device 100 according to an embodiment of the inventive concept. Referring to FIG. 1, the semiconductor memory device 100 includes a bit line pair including a bit line BL and a complementary bit line BLB, a sense amplifying unit 120, and a precharge unit 140.

A first memory cell MC1 is connected to the bit line BL, and a second memory cell MC2 is connected to the complementary bit line BLB. The sense amplifying unit 120 includes first through third sense amplifiers 122, 124, and 126 sensing and amplifying the voltage of the bit line pair including the bit line BL and the complementary bit line BLB, and first and second current sources 128 and 130 enabling the first and second sense amplifiers 122 and 124.

The first sense amplifier 122 includes first and second n-channel metal oxide semiconductor (NMOS) transistors N1 and N2 connected between the bit line BL and the complementary bit line BLB. A gate of the first NMOS transistor N1 is connected to the complementary bit line BLB, and a gate of the second NMOS transistor N2 is connected to the bit line BL, such that the first and second NMOS transistors N1 and N2 are cross-coupled to each other. Since the first NMOS transistor N1 is designed to have a width that is greater than that of the second NMOS transistor N2, the first NMOS transistor N1 has a current driving capability greater than the second NMOS transistor N2. A first node LACB, which is a connection node between the first NMOS transistor N1 and the second NMOS transistor N2, is connected to the first current source 128.

The first current source 128 enables the first sense amplifier in response to a first sensing enable signal LACNG. The first current source 128 is connected between the first node LACB and a ground voltage terminal, and includes an NMOS transistor having a gate to which the first sensing enable signal LACNG is applied. While the first sensing enable signal LACNG is activated, the first current source 128 sinks driving currents for the sensing operation of the first sense amplifier 122.

If the first sense amplifier 122 senses data having a logic level "1" stored in the first memory cell MC1, charge sharing occurs between the bit line BL and the complementary bit line BLB which are precharged to the same voltage, and then the voltage of the bit line BL is increased to be higher than that of the complementary bit line BLB by ΔV. Accordingly, a current flowing through the second NMOS transistor N2 is higher than a current flowing through the first NMOS transistor N1, and is sunk by the first current source 128.

If the first sense amplifier 122 senses data having a logic level "0" stored in the first memory cell MC1, charge sharing occurs between the bit line BL and the complementary bit line BLB which are precharged to the same voltage, and then the voltage of the bit line BL is decreased to be less than that of the complementary bit line BLB by ΔV. Accordingly, a current flowing through the first NMOS transistor N1 is higher than a current flowing through the second NMOS transistor N2, and is sunk by the first current source 128.

The second sense amplifier 124 includes third and fourth NMOS transistors N3 and N4 connected between the bit line BL and the complementary bit line BLB. A gate of the third NMOS transistor N3 is connected to the complementary bit line BLB and a gate of the fourth NMOS transistor N4 is connected to the bit line BL, so that the third and fourth NMOS transistors N3 and N4 are cross-coupled to each other. Since the fourth NMOS transistor N4 is designed to have a width that is greater than that of the third NMOS transistor N3, the fourth NMOS transistor N4 has a current driving capability greater than the third NMOS transistor N3. A second node LATB, which is a connection node between the third NMOS transistor N3 and the fourth NMOS transistor N4, is connected to the second current source 130.

The second current source 130 enables the second sense amplifier 124 in response to a second sensing enable signal LATNG. The second current source 130 is connected between the second node LATB and a ground voltage terminal, and includes an NMOS transistor having a gate to which the second sensing enable signal LATNG is applied. The second current source 130 sinks driving currents for the sensing operation of the second sense amplifier 124 while the second sensing enable signal LATNG is activated.

If the second sense amplifier 124 senses data having a logic level "1" stored in the first memory cell MC1, charge sharing occurs between the bit line BL and the complementary bit line BLB which are precharged to the same voltage, and then the voltage of the bit line BL is increased to be higher than that of the complementary bit line BLB by ΔV. Accordingly, a current flowing through the fourth NMOS transistor N4 is higher than a current flowing through the third NMOS transistor N3, and is sunk by the second current source 130.

If the second sense amplifier 124 senses data having a logic level "0" stored in the first memory cell MC1, charge sharing occurs between the bit line BL and the complementary bit line BLB which are precharged to the same voltage, and then the voltage of the bit line BL is decreased to be less than that of the complementary bit line BLB by ΔV. Accordingly, a current flowing through the third NMOS transistor N3 is higher than a current flowing through the fourth NMOS transistor N4, and is sunk by the second current source 130.

The structures of the first sense amplifier 122 and the second sense amplifier 124 will now be described. The first and second NMOS transistors N1 and N2 and the third and fourth NMOS transistors N3 and N4 connected between the bit line BL and the complementary bit line BLB are asymmetric with each other. Each of the first and second NMOS transistors N1 and N4 has a high current driving capability, and each of the second and third NMOS transistors N2 and N3 has a low current driving capability. The first and fourth NMOS transistors N1 and N4 may be designed to have the same size, and the second and third NMOS transistors N2 and N3 may be designed to have the same size.

If the first and second sensing enable signals LACNG and LATNG are simultaneously activated and data having a logic level "1" stored in the first memory cell MC1 is sensed, charge sharing occurs between the bit line BL and the complementary bit line BLB which are precharged to the same voltage, and then the voltage of the bit line BL is increased to be higher than that of the complementary bit line BLB by ΔV, so that a current flowing through the second NMOS transistor N2 and a current flowing through the fourth NMOS transistor N4 are sunk by the first current source 128 and the second current source 130. Accordingly, the voltage of the complementary bit line BLB is decreased to a ground voltage VSS.

If the first and second sensing enable signals LACNG and LATNG are simultaneously activated and data having a logic level "0" stored in the first memory cell MC1 is sensed, charge sharing occurs between the bit line BL and the complementary bit line BLB which are precharged to the same voltage, and then the voltage of the bit line BL is decreased to be less than that of the complementary bit line BLB by ΔV, so that a current flowing through the first NMOS transistor N1 and a current flowing through the third NMOS transistor N3 are sunk by the first current source 128 and the second current source 130. Accordingly, the voltage of the bit line BLB is decreased to the ground voltage VSS.

The third sense amplifier 126 includes first and second PMOS transistors P1 and P2 connected between the bit line BL and the complementary bit line BLB. A gate of the first PMOS transistor P1 is connected to the complementary bit line BLB and a gate of the second PMOS transistor P2 is connected to the bit line BL, such that the first and second PMOS transistors P1 and P2 are cross-coupled to each other. A connection node between the first PMOS transistor P1 and the second PMOS transistor P2 is connected to a power voltage terminal. Since the first PMOS transistor P1 and the second PMOS transistor P2 are designed to have the same width, the first PMOS transistor P1 and the second PMOS transistor P2 have the same current driving capability.

If the third sense amplifier 126 senses data having a logic level "1" stored in the first memory cell MC1, charge sharing occurs between the bit line BL and the complementary bit line BLB which are precharged to the same voltage, and then the voltage of the bit line BL is increased to be higher than that of the complementary bit line BLB by ΔV. Accordingly, a current flowing through the first PMOS transistor P1 is higher than a current flowing through the second PMOS transistor P2, and the voltage of the bit line BL is increased to a power voltage VINTA.

If the third sense amplifier 126 senses data having a logic level "0" stored in the first memory cell MC1, charge sharing occurs between the bit line BL and the complementary bit line BLB which are precharged to the same voltage, and then the voltage of the bit line BL is decreased to be less than that of the complementary bit line BLB by ΔV. Accordingly, a current flowing through the second PMOS transistor P2 is higher than a current flowing through the first PMOS transistor P1, and the voltage of the complementary bit line BLB is increased to the power voltage VINTA.

If data having a logic level "1" stored in the first memory cell MC1 is sensed, by using the first through third sense amplifiers 122, 124, and 126 and the first and second current sources 128 and 130, the sense amplifying unit 120 causes charge sharing between the bit line BL and the complementary bit line BLB which are precharged to the same voltage, and then increases the voltage of the bit line BL to the power voltage VINTA and decreases the voltage of the complementary bit line BLB to the ground voltage VSS. Likewise, if data having a logic level "0" stored in the first memory cell MC1 is sensed, by using the first through third sense amplifiers 122, 124, and 126 and the first and second current sources 128 and 130, the sense amplifying unit 120 causes charge sharing between the bit line BL and the complementary bit line BLB which are precharged to the same voltage, and then decreases the voltage of the bit line BL to the ground voltage VSS and increases the voltage of the complementary bit line BLB to the power voltage VINTA.

The precharge unit 140 precharges the bit line BL and the complementary bit line BLB to the same voltage. The precharge unit 140 includes a first precharge unit 142 and a second precharge unit 144. The first precharge unit 142 applies the power voltage VINTA to the first and second nodes LACB and LATB in the sense amplifying unit 120 in response to a first precharge signal PEQ_SA. The first precharge unit 142 includes a third PMOS transistor P3 connected between a power voltage terminal and the first node LACB and the first node LACB and controlled by the first precharge signal PEQ_SA, and a fourth PMOS transistor P4 connected between the power voltage terminal and the second node LATB and controlled by the first precharge signal PEQ_SA.

The second precharge unit 144 equalizes the bit line BL and the complementary bit line BLB in response to a second precharge signal PEQIJ. The second precharge unit 144 includes a fifth PMOS transistor P5 connected between the bit line BL and the complementary bit line BLB and controlled by the second precharge signal PEQIJ.

Figure 2:
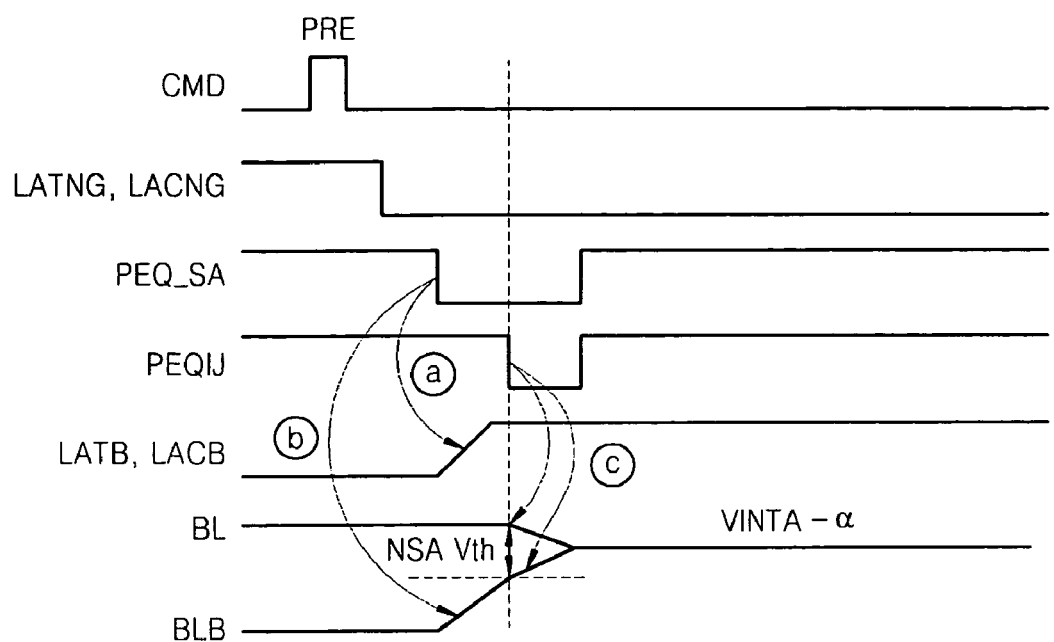
FIG. 2 is a timing diagram illustrating the bit line preacharge operation of a precharge unit of the semiconductor memory device of FIG. 1.

FIG. 2 is a timing diagram illustrating the bit line precharge operation of the precharge unit 140 of the semiconductor memory device of FIG. 1. Referring to FIGS. 1 and 2, if a precharge command PRE is applied to the semiconductor memory device 100, the first and second sensing enable signals LACNG and LATNG are inactivated as a logic low level, and the first and second sense amplifiers 122 and 124 are disabled. It is assumed that due to a previous operation of sensing and amplifying data having a logic level "1" stored in the first memory cell MC1, the voltage of the bit line BL developed to the power voltage VINTA and the voltage of the complementary bit line BLB is developed to the ground voltage VSS. When the first precharge signal PEQ_SA is activated as a logic low level, the third and fourth PMOS transistors P3 and P4 of the first precharge unit 142 are turned on, and the voltages of the first and second nodes LACB and LATB are increased to the power voltage VINTA (ⓐ). Accordingly, the voltage of the complementary bit line BLB is gradually increased from the ground voltage VSS by the second and fourth NMOS transistors N2 and N4 in the sense amplifying unit 120 (ⓑ) to a voltage VINTA-(NSA_Vth), where NSA_Vth denotes a threshold voltage NSA_Vth of the second and fourth NMOS transistors N2 and N4. Accordingly, a voltage difference between the bit line BL and the complementary bit line BLb is approximately equal to the threshold voltage NSA_Vth of the second and fourth NMOS transistors N2 and N4.

Next, when the second precharge signal PEQIJ is activated to a logic low level, the fifth PMOS transistor P5 of the second precharge unit 144 is turned on, and the bit line BL and the complementary bit line BLB are equalized. The bit line BL whose voltage remained at the power voltage VINTA and the complementary bit line BLB whose voltage increased to the voltage VINTA-(NSA_Vth) are equalized to a voltage VINTA-(NSA_Vth)/2 (ⓒ). That is, the bit line BL and the complementary bit line BLB are precharged to a voltage VINTA-α, where α denotes a predetermined voltage. The predetermined voltage α is half of the threshold voltage NSA_Vth of the second and fourth NMOS transistors N2 and N4.

Figure 3:
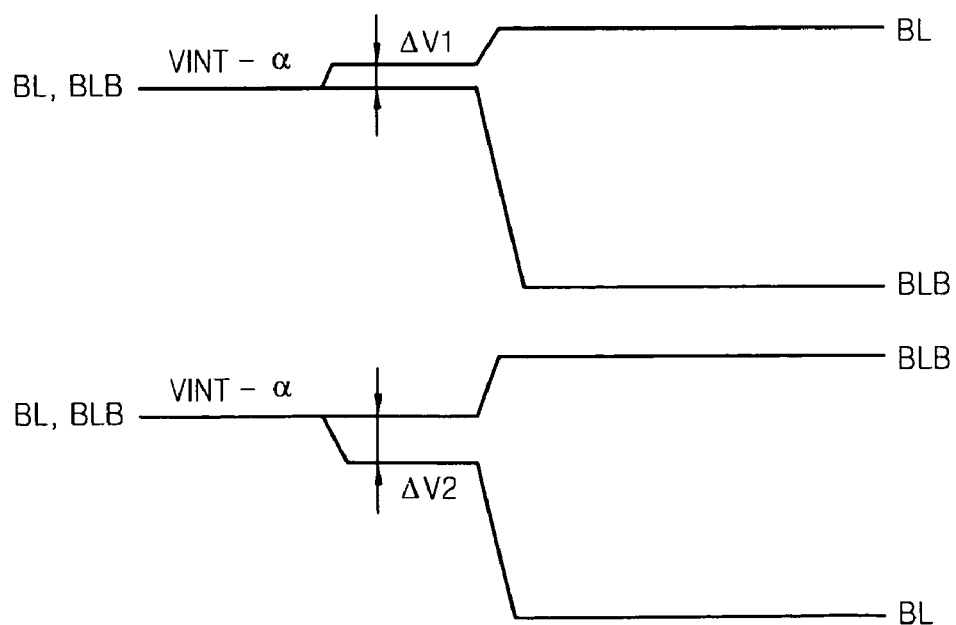
FIG. 3 is a diagram illustrating the sensing operation of the semiconductor memory device of FIG. 1.

FIG. 3 is a diagram illustrating the sensing operation of the semiconductor memory device 100 of FIG. 1 after the bit line precharge operation of FIG. 2. Referring to FIG. 3, if data D1 having a logic level "1" stored in the first memory cell MC1 is sensed, charge sharing occurs between the bit line BL and the complementary bit line BLB which are precharged to the voltage VINT-α during the bit line precharge operation of FIG. 2, and then the voltage of the bit line BL is increased to be higher than that of the complementary bit line BLB by ΔV1, thereby forming a sensing margin. Accordingly, a problem of a conventional FVBP scheme where there is no charge sharing voltage for a bit line when data having a logic level "1" stored in a memory cell is sensed can be solved.

If data D0 having a logic level "0" stored in the first memory cell MC1 is sensed, charge sharing occurs between the bit line BL and the complementary bit line BLB which are precharged to the VINT-α during the bit line precharge operation of FIG. 2, and then the voltage of the bit line BLB is decreased to be less than that of the complementary bit line BLB by ΔV2, which is less than a charge sharing voltage for a bit line when data having a logic level "0" stored a memory cell is sensed by the conventional FVBP scheme, but is not too small to affect a sensing margin.

Figure 4:
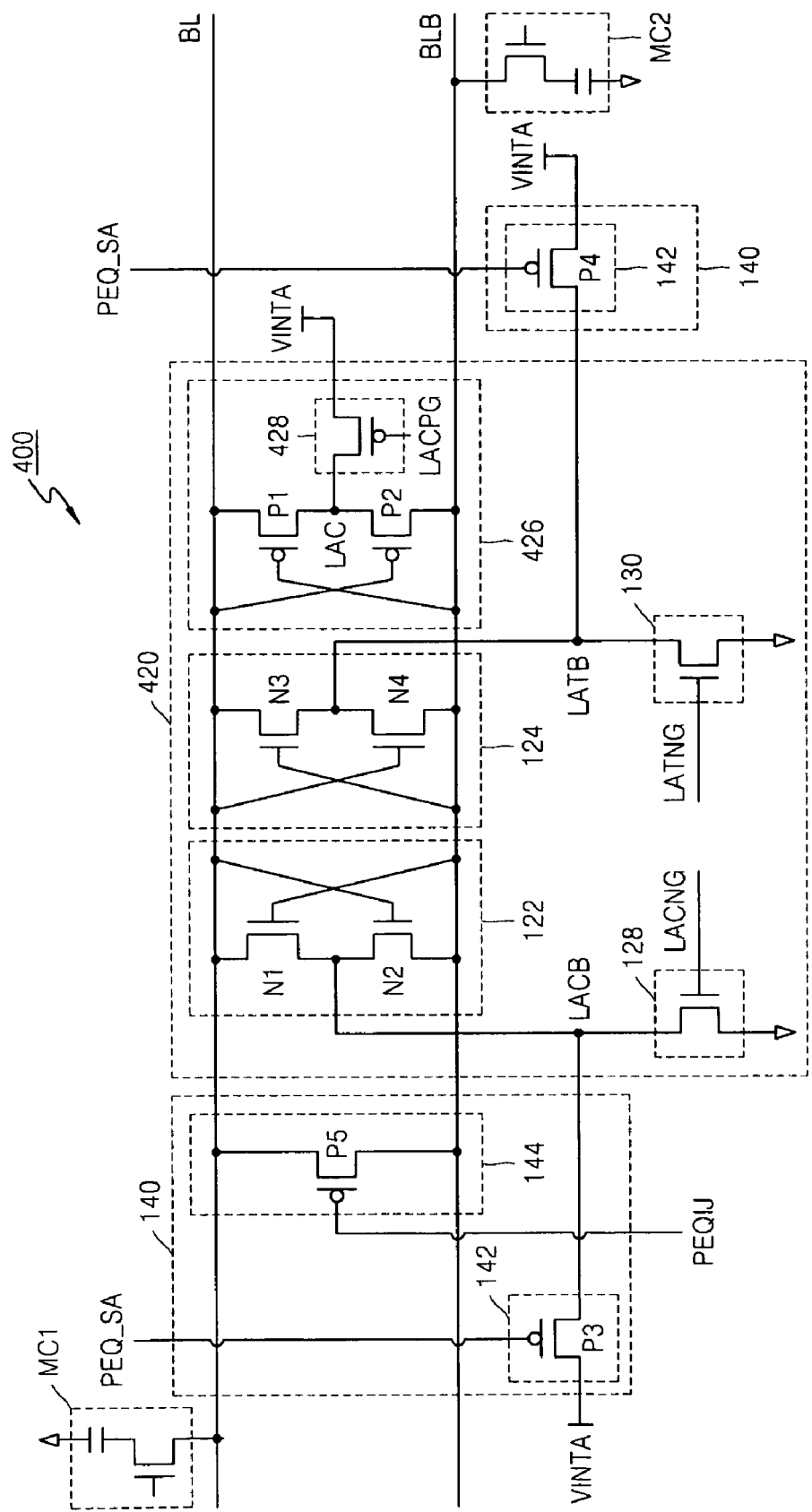
FIG. 4 is a circuit diagram of a semiconductor memory device according to another embodiment of the inventive concept.

FIG. 4 is a circuit diagram illustrating a semiconductor memory device according to another embodiment of the inventive concept. Referring to FIG. 4, the semiconductor memory device 400 of FIG. 4 is different from the semiconductor memory device 100 of FIG. 1 in that a connection node LAC between first and second PMOS transistors P1 and P2 of a third sense amplifier 426 in a sense amplifying unit 420 is connected to a third current source 428.

The third current source 428 enables the third sense amplifier 426 in response to a third sensing enable signal LACPG. The third current source 428 includes a PMOS transistor connected between a third node LAC and a power voltage terminal and having a gate to which the third sensing enable signal LACPG is applied. The third current source 428 supplies driving currents for the sensing operation of the third sense amplifier 426 while the third sensing enable signal LACPG is activated. Also, the third current source 428 cuts off a driving current supply while the third sensing enable signal LACPG is inactivated, in order to disable the third sense amplifier 426. Accordingly, a risk that a precharge voltage for the bit line BL and the complementary bit line BLB may be increased due to a leakage current in the first and second PMOS transistors P1 and P2 of the third sense amplifier 426 of FIG. 4 can be avoided.

Figure 5:
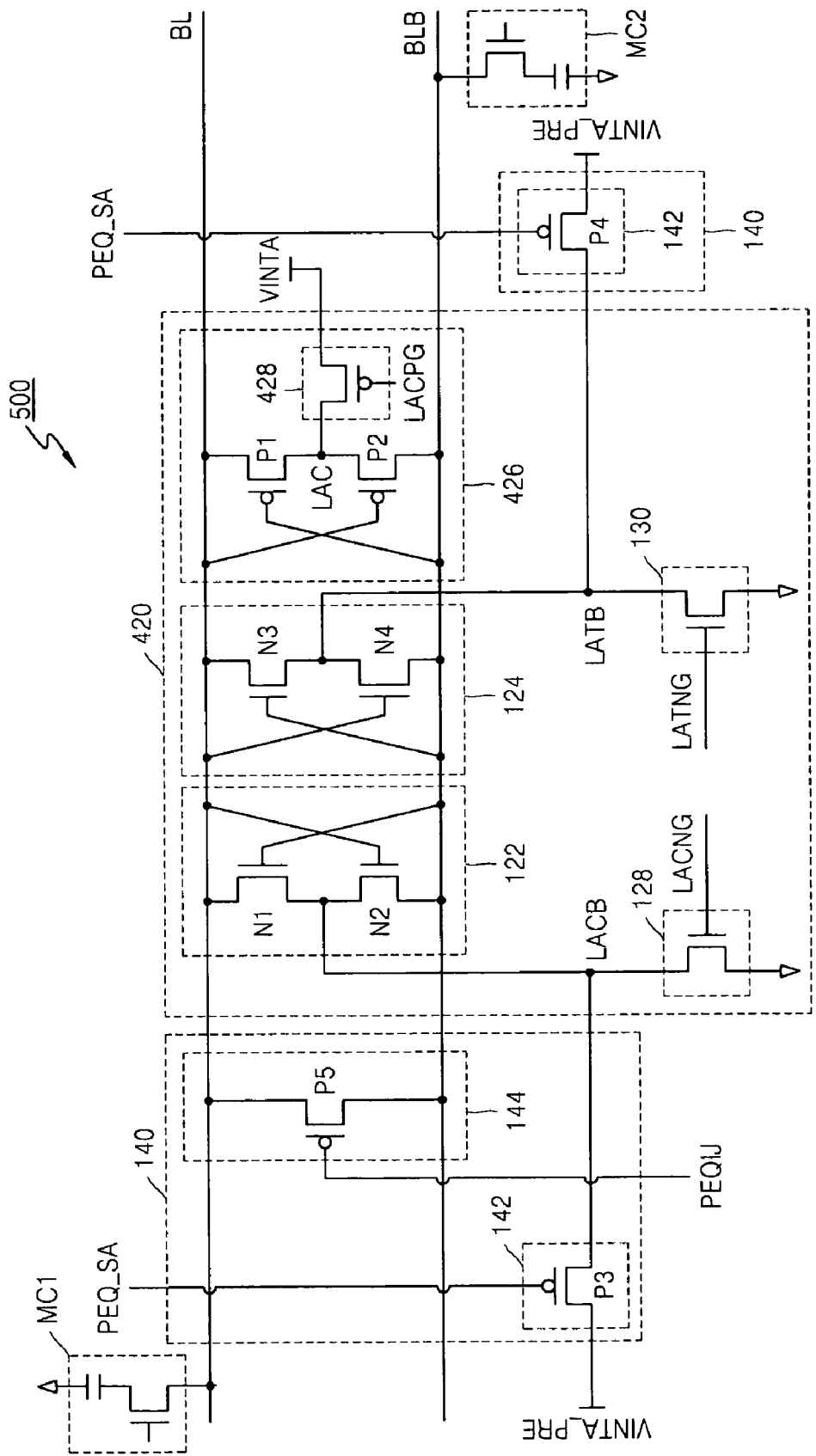
FIG. 5 is a circuit diagram of a semiconductor memory device according to another embodiment of the inventive concept.

In FIGS. 1 and 4, the sense amplifying unit 120 and the precharge unit 140 use the same power voltage VINTA. However, as shown in FIG. 5, a power source for the sense amplifying unit 120 and a power source for the precharge unit 140 may be separated and thus the sense amplifying unit 120 and the precharge unit 140 use different internal power voltages as shown in FIG. 5. FIG. 5 is a circuit diagram of a semiconductor memory device 500 according to another embodiment of the inventive concept. Referring to FIG. 5, the precharge unit 140 uses a precharge voltage VINT_PRE that is less than the power voltage VINTA. If data having a logic level "1" is sensed, since the precharge voltage VINT_PRE for the bit line BL and the complementary bit line BLB is decreased to a voltage VINT_PRE-α where α amounts to half of the threshold voltage NSA_Vth of the second and fourth NMOS transistors N2 and N4 as described above, the semiconductor memory device 500 of FIG. 5 has a sensing margin that is greater than that obtained when the semiconductor memory device 100 of FIG. 1 is used.

Figure 6:
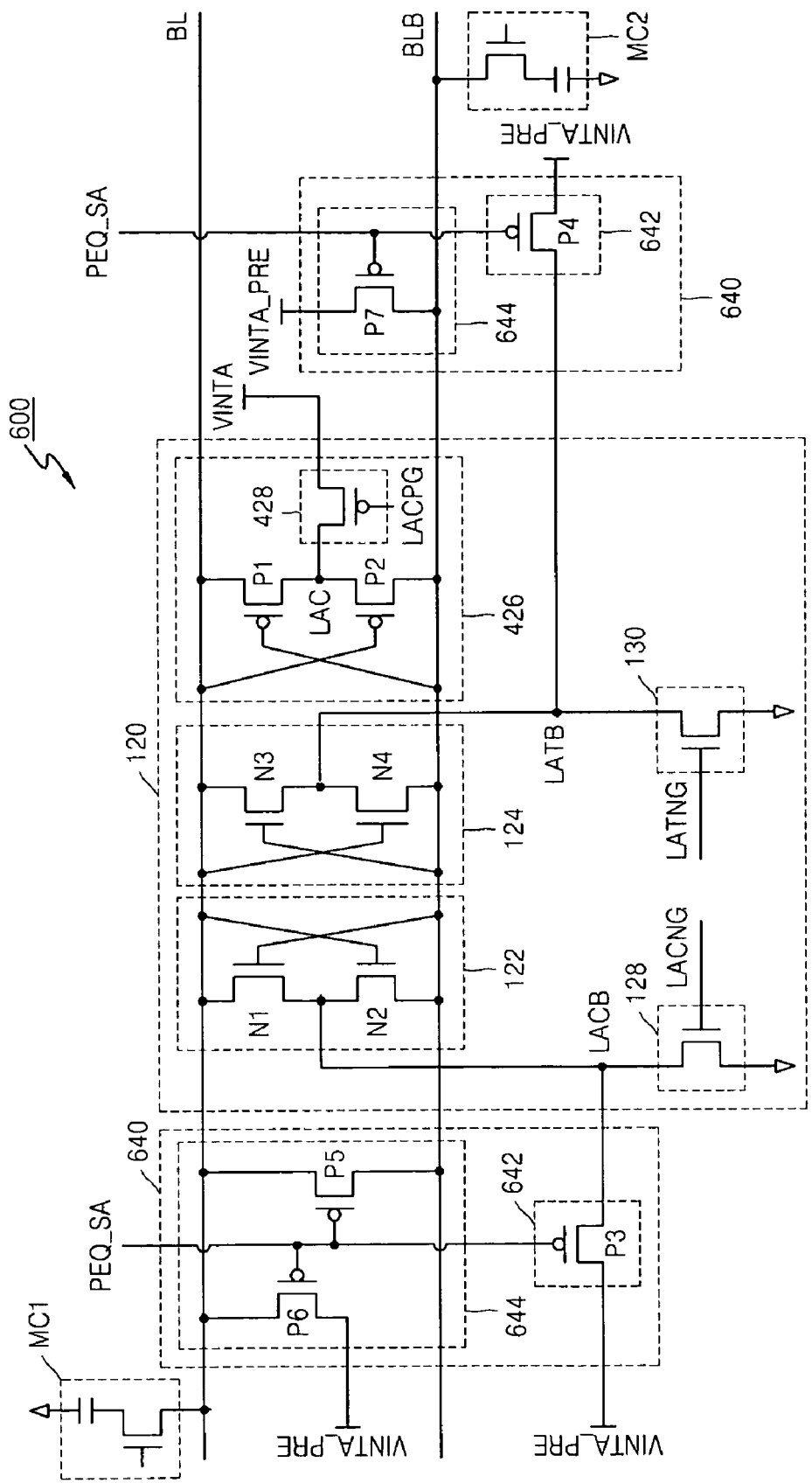
FIG. 6 is a circuit diagram of a semiconductor memory device according to another embodiment of the inventive concept.

FIG. 6 is a circuit diagram illustrating a semiconductor memory device 600 according to another embodiment of the inventive concept. Referring to FIG. 6, the semiconductor memory device 600 of FIG. 6 is different from the semiconductor memory device 500 of FIG. 5 in that a second precharge unit 644 in a precharge unit 640 precharges the bit line BL and the complementary bit line BLB to the precharge voltage VINT_PRE in response to the first precharge signal PEQ_SA. The second precharge unit 644 includes a fifth PMOS transistor P5 connected between the bit line BL and the complementary bit line BLB and responding to the first precharge signal PEQ_SA, a sixth PMOS transistor P6 connected between a precharge voltage terminal and the bit line BL and responding to the first precharge signal PEQ_SA, and a seventh PMOS transistor P7 connected between the precharge voltage terminal and the complementary bit line BLB and responding to the first precharge signal PEQ_SA.

Since the semiconductor memory device 600 precharges the bit line BL and the complementary bit line BLB to the precharge voltage VINT_PRE that is less than the power voltage VINT by using the precharge unit 640, if data having a logic level "1" stored in the first memory cell MC1 is sensed, the semiconductor memory device 600 has a sensing margin that is greater than that obtained when the conventional FVBP scheme is used.

Figure 7:
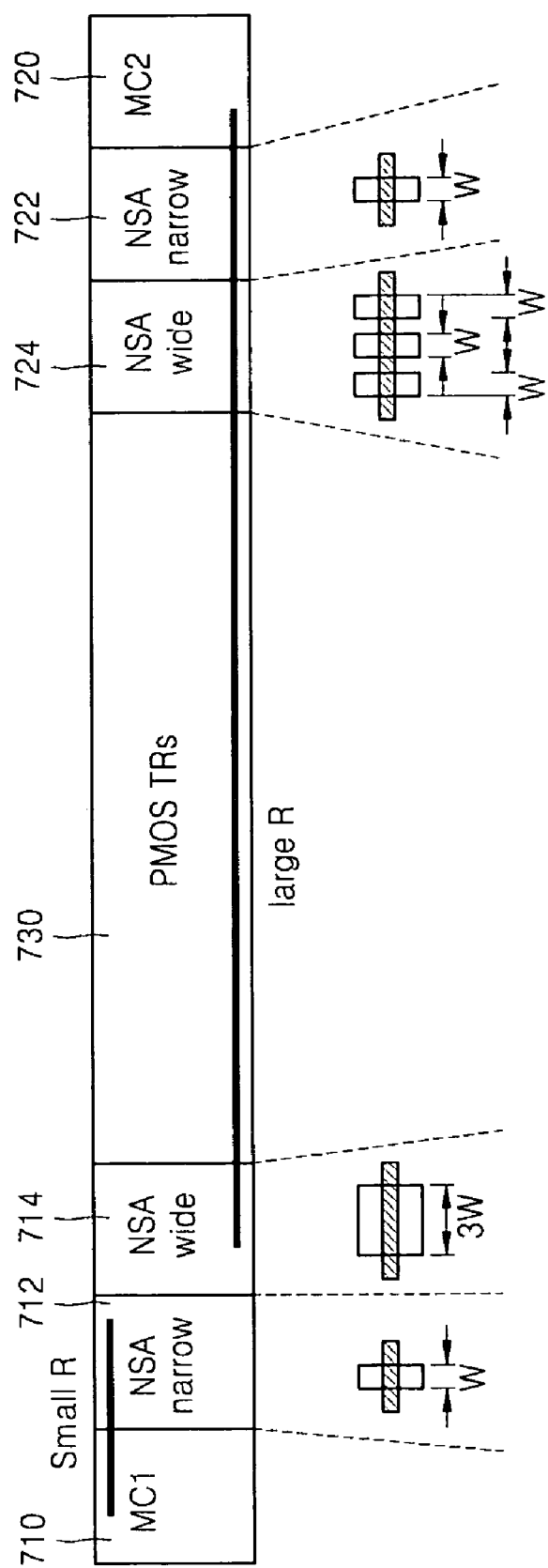
FIG. 7 is a schematic diagram illustrating a method of configuring the semiconductor memory device of FIG. 1, according to an embodiment of the inventive concept.

In FIGS. 1 through 6, each of the first and fourth NMOS transistors N1 and N4 in the first and second sense amplifiers 122 and 124 which are asymmetric with each other has a high current driving capability, and each of the second and third NMOS transistors N2 and N3 in the first and second sense amplifiers 122 and 124 which are asymmetric with each other has a low current driving capability. FIG. 7 is a diagram illustrating a method of configuring the semiconductor memory device 100 of FIG. 1, according to an embodiment of the inventive concept.

Referring to FIGS. 1 and 7, the sense amplifier 120 and the precharge unit 140 are disposed between a first area 710 in which the first memory cell MC1 is disposed and a second area 720 in which a second memory cell MC2 is disposed. The third NMOS transistor N3 is disposed in a third area 712 adjacent to the first area 710 in which the first memory cell MC1 connected to the bit line BL is disposed. The third NMOS transistor N3 having a low current driving capability, that is, a narrow width, is connected to the bit line BL. The first NMOS transistor N1 connected to the bit line BL is disposed in a fourth area 714 adjacent to the third area 712. The first NMOS transistor N1 has a high current driving capability, that is, a wide width.

The second NMOS transistor N2 is disposed in a fifth area 722 adjacent to the second area 720 in which the second memory cell MC2 connected to the complementary bit line BLB is disposed. The second NMOS transistor N2 is connected to the complementary bit line BLB, and has a low current driving capability, that is, a narrow width. The fourth NMOS transistor N4 connected to the complementary bit line BLB is connected to a sixth area 724 adjacent to the fifth area 722. The fourth NMOS transistor N4 has a high current driving capability, that is, a wide width.

The PMOS transistors P1, P2, and P5 of the sense amplifying unit 120 and the precharge unit 140 connected between the bit line BL and the complementary bit line BLB are connected to a seventh area 730 between the fourth area 714 and the sixth area 724.

Since the NMOS transistors N2 and N3 each having the low current driving capability, that is, the narrow width, are disposed adjacent to the first and second memory cells MC1 and MC2, a line resistance between the transistors N2 and N3 and the first and second memory cells MC1 and MC2 is set to a low value. Since the NMOS transistors N1 and N4 each having the high current driving capability, that is, the wide width, are disposed far away from the first and second memory cells MC1 and MC2, a line resistance between the transistors N1 and N4 and the first and second memory cells MC1 and MC2 is set to a high value. Accordingly, the sensing speed of the sense amplifying unit 120 in which the first and second NMOS transistors N1 and N2 and the third and fourth NMOS transistors N3 and N4 are asymmetric with each other can be optimized.

For example, it is assumed that the width of each of the second and third NMOS transistors N2 and N3 is 'W' and the width of each of the first and fourth NMOS transistors N1 and N4 is '3W'. The semiconductor memory device 100 of FIG. 1 may be configured in several ways. First, as shown in the third area 712 and the fourth area 714, the third NMOS transistor N3 having the width '3W' may be disposed in the third area 712, and the first NMOS transistor N1 having the width '3W' and having one active area may be disposed in the fourth area 714. Likewise, the second NMOS transistor N2 having the width 'W' may be disposed in the firth area 722, and the fourth NMOS transistor N4 having the width '3W' may be disposed in the sixth area 724.

Second, in order to optimize a mismatch margin due to a threshold voltage mismatch between the first through fourth NMOS transistors N1 through N4, the transistors N1 and N4 each having the high current driving capability may be disposed to include active areas the number of which is equal to a number obtained by dividing the width of each of the transistors N1 and N4 by the width of each the transistors N2 and N3 each having the low current driving capability. That is, as shown in the fifth area 722 and the sixth area 724, the second NMOS transistor N2 having the width 'W' may be disposed in the fifth area 722 and the fourth NMOS transistor N4 including three active areas each having the width 'W' may be disposed in the sixth area 724. Likewise, the third NMOS transistor N3 having the width 'W' may be disposed in the third area 712 and the first NMOS transistor N1 including three active areas each having the width 'W' may be disposed in the fourth area 714.

As described above, according to the semiconductor memory device of the inventive concept, if data having a logic level "1" is sensed, since charge sharing occurs between a bit line and a complementary bit line which are precharged from a power voltage to a precharge voltage that is less than the power voltage during a bit line precharge operation, and then the voltage of the bit line is increased to be higher by a voltage $\Delta V$ than the voltage of the complementary bit line, a sensing margin can be obtained.

According to the method of configuring the semiconductor memory device of the inventive concept, since the semiconductor memory device is configured so that a resistance between transistors each having a low current driving capability and first and second memory cells is low and a resistance between transistors each having a high current driving capability and the first and second memory cells is high, the sensing speed of an asymmetric sense amplifier can be optimized.

Moreover, since each of the transistors each having the high current driving capability is disposed to have active areas of which number is equal to a number obtained by dividing the width of each of the transistors each having the high current driving capability by the width of each of the transistors having the low current driving capability, a mismatch margin due to a threshold voltage mismatch between the transistors constituting the asymmetric sense amplifier can be optimized.

While the inventive concept has been particularly shown and described with reference to exemplary embodiments thereof, it will be understood that various changes in form and details may be made therein without departing from the spirit and scope of the following claims. For example, although each of the first and second NMOS transistors N1 and N4 has the high current driving capability and each of the second and third NMOS transistors N2 and N3 has the high current driving capability in the above embodiments, each of the first and fourth NMOS transistors N1 and N4 may have a low current driving capability and each of the second and third NMOS transistors N2 and N3 may have a high current driving capability. Accordingly, the scope of protection of the inventive concept should be defined by the technical spirit and scope of the following claims.

What is claimed is:

1. A semiconductor memory device comprising:
a bit line pair comprising a bit line and a complementary bit line;
a precharge unit precharging the bit line and the complementary bit line to a voltage that is a first voltage less than a power voltage; and
a sense amplifying unit comprising first and second transistors driven by a first current source and serially connected between the bit line and the complementary bit line to be cross-coupled to each other, wherein a gate of the first transistor is connected to the complementary bit line and a gate of the second transistor is connected to the bit line,
wherein the first voltage is determined by the first or the second transistor, and
wherein the precharge unit includes:
a third transistor connected between a node to which the first and second transistors and the first current source are connected, and a power voltage terminal, the third transistor being controlled by a first precharge signal; and
a fourth transistor connected between the bit line and the complementary bit line and controlled by a second precharge signal.

2. The semiconductor memory device of claim 1, wherein the second precharge signal is activated a predetermined period of time after the first precharge signal is activated.

3. The semiconductor memory device of claim 1, wherein the sense amplifying unit further comprises third and fourth transistors driven by a second current source and serially connected between the bit line and the complementary bit line to be cross-coupled to each other, wherein a gate of the third transistor is connected to the complementary bit line and a gate of the fourth transistor is connected to the bit line,
wherein the first voltage is determined by the third or fourth transistor.

4. The semiconductor memory device of claim 3, wherein each of the first and fourth transistors of the sense amplifying unit has a driving capability that is greater than that of each of the second and third transistors of the sense amplifying unit.

5. The semiconductor memory device of claim 4, wherein the precharge unit comprises:
a fifth transistor connected between the node to which the first and second transistors and the first current source are connected and a first voltage terminal, the fifth transistor being controlled by a first precharge signal;
a sixth transistor connected between a node to which the third and fourth transistors and the second current source are connected and the first voltage terminal, the sixth transistor being controlled by the first precharge signal; and
a seventh transistor connected between the bit line and the complementary bit line and controlled by a second precharge signal.

6. The semiconductor memory device of claim 5, wherein the second precharge signal is activated a predetermined period of time after the first precharge signal is activated.

7. A semiconductor memory device comprising:
a bit line pair comprising a bit line and a complementary bit line;
a sense amplifying unit comprising a first sense amplifier driven by a first current source and connected between the bit line and the complementary bit line, and a second sense amplifier driven by a second current source and connected between the bit line and the complementary bit line;
a first precharge unit precharging, in response to a first precharge signal, a first node to which the first current source in the first sense amplifier is connected and a second node to which the second current source in the second sense amplifier is connected, wherein the first precharge unit includes:

a first transistor connected between the first node and a power voltage terminal and controlled by the first precharge signal; and a second transistor connected between the second node and the power voltage terminal and controlled by the first precharge signal; and a second precharge unit equalizing, in response to a second precharge signal, the first node and the second node.

8. The semiconductor memory device of claim 7, wherein the second precharge unit comprises a third transistor connected between the bit line and the complementary bit line and controlled by the second precharge signal.

9. The semiconductor memory device of claim 8, wherein the second precharge signal is activated a predetermined period of time after the first precharge signal is activated.

10. A semiconductor memory device comprising:
a bit line pair comprising a bit line and a complementary bit line;
a sense amplifying unit comprising a first sense amplifier driven by a first current source and connected between the bit line and the complementary bit line, and a second sense amplifier driven by a second current source and connected between the bit line and the complementary bit line;
a first precharge unit precharging, in response to a first precharge signal, a first node to which the first current source in the first sense amplifier is connected and a second node to which the second current source in the second sense amplifier is connected, wherein the first precharge unit includes:
a first transistor connected between the first node and a precharge voltage terminal and controlled by the first precharge signal; and
a second transistor connected between the second node and the precharge voltage terminal and controlled by the first precharge signal; and
a second precharge unit equalizing, in response to a second precharge signal, the first node and the second node.

11. The semiconductor memory device of claim 10, wherein the second precharge unit comprises a third transistor connected between the bit line and the complementary bit line and controlled by the second precharge signal.

12. The semiconductor memory device of claim 11, wherein the second precharge signal is activated a predetermined period of time after the first precharge signal is activated.

13. The semiconductor memory device of claim 7, wherein the sense amplifying unit further comprises first and second p-channel metal oxide semiconductor (PMOS) transistors serially connected between the bit line and the complementary bit line to be cross-coupled to each other wherein a gate of the first PMOS transistor is connected to the complementary bit line and a gate of the second PMOS transistor is connected to the bit line,
wherein a connection node between the first and second PMOS transistors is connected to a power voltage terminal.

14. The semiconductor memory device of claim 7, wherein the sense amplifying unit further comprises first and second PMOS transistors serially connected between the bit line and the complementary bit line to be cross-coupled to each other, wherein a gate of the first PMOS transistor is connected to the complementary bit line and a gate of the second PMOS transistor is connected to the bit line,
wherein a connection node between the first and second PMOS transistors is connected to a power voltage terminal through a third PMOS transistor that responds to a sensing enable signal.

15. A semiconductor memory device comprising:
a bit line pair comprising a bit line and a complementary bit line;
a precharge unit precharging the bit line and the complementary bit line a voltage that is a first voltage less than the precharge voltage, wherein the precharge unit includes comprises:
a third transistor connected between a precharge voltage terminal and a connection node between the first transistor and the second transistor, and controlled by the precharge signal;
a fourth transistor connected between the precharge voltage terminal and the bit line and controlled by the precharge signal;
a fifth transistor connected between the precharge voltage terminal and the complementary bit line and controlled by the precharge signal; and
a sixth transistor connected between the bit line and the complementary bit line and controlled by the precharge signal; and
a sense amplifying unit comprising first and second transistors serially connected between the bit line and the complementary bit line to be cross-coupled to each other, wherein a gate of the first transistor is connected to the complementary bit line and a gate of the second transistor is connected to the bit line,
wherein the first voltage is determined by the first or second transistor.

16. The semiconductor memory device of claim 15, wherein the sense amplifying unit further comprises first and second PMOS transistors serially connected between the bit line and the complementary bit line to be coupled to each other, wherein a gate of the first PMOS transistor is connected to the complementary bit line and a gate of the second PMOS transistor is connected to the bit line,
wherein a connection node between the first and second PMOS transistors is connected to a power voltage terminal.

17. The semiconductor memory device of claim 15, wherein the sense amplifying unit further comprises first and second PMOS transistors serially connected between the bit line and the complementary bit line to be cross-coupled to each other, wherein a gate of the first PMOS transistor is connected to the complementary bit line and a gate of the second PMOS transistor is connected to the bit line,
wherein a connection node between the first and second PMOS transistors is connected to a power voltage terminal through a third PMOS transistor that responds to a sensing enable signal.

18. A method of configuring a semiconductor memory device comprising:
providing a bit line to which a first memory cell is connected;
providing a complementary bit line to which a second memory cell is connected;
providing an asymmetric sense amplifier comprising first and second transistors connected to a first current source and connected between the bit line and the complementary bit line to be cross-coupled to each other and third and fourth transistors connected to a second current source and connected between the bit line and the complementary bit line to be cross-coupled to each other, wherein each of the first and fourth transistors has a current driving capability that is greater than that of each of the second and third transistors; and disposing the third transistor having the low current driving capability adjacent to the first memory cell and the second transistor having the low current driving capability adjacent to the second memory cell.

19. The method of claim 18, wherein the first transistor is disposed adjacent to the second transistor.

20. The method of claim 19, wherein the first transistor comprises active areas the number of which is equal to a number obtained by dividing the width of the first transistor by the width of the second transistor.

21. The method of claim 18, wherein the fourth transistor is disposed adjacent to the third transistor.

22. The method of claim 21, wherein the fourth transistor comprises active areas the number of which is equal to a number obtained by dividing the width of the fourth transistor by the width of the third transistor.

23. The method of claim 18, wherein the first transistor and the fourth transistor have the same size.

24. The method of claim 18, wherein the second transistor and the third transistor have the same size.

* * * * *